(12) United States Patent
Hoentschel et al.

(10) Patent No.: US 9,553,046 B2
(45) Date of Patent: Jan. 24, 2017

(54) E-FUSE IN SOI CONFIGURATION (71) Applicant: GLOBALFOUNDRIES Inc., Grand Cayman (KY)

(72) Inventors: Jan Hoentschel, Dresden (DE); Peter Baars, Dresden (DE); Hans-Peter Moll, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/718,502

(22) Filed: May 21, 2015

(65) Prior Publication Data

US 2016/0343659 A1 Nov. 24, 2016

(51) Int. Cl.
| | |
|---|---|
| *H01L 21/331* | (2006.01) |
| *H01L 23/525* | (2006.01) |
| *H01L 21/84* | (2006.01) |
| *H01L 27/12* | (2006.01) |

(52) U.S. Cl.
CPC ........... *H01L 23/5256* (2013.01); *H01L 21/84* (2013.01); *H01L 27/12* (2013.01)

(58) Field of Classification Search
CPC ................. H01L 23/5256; H01L 23/62–23/66; H01L 23/5225; H01L 27/1026; H01L 27/11206; H01L 23/525; H01L 23/53209; H01L 28/24; H01L 29/4975; H01L 29/665; H01L 29/7845; H01L 21/02425; H01L 21/28052
See application file for complete search history.

(56) References Cited

U.S. PATENT DOCUMENTS

| | | | | |
|---|---|---|---|---|
| 2007/0120218 | A1* | 5/2007 | Hsu ..................... | H01L 23/5256 257/529 |
| 2009/0108396 | A1* | 4/2009 | Chidambarrao .... | H01L 23/5256 257/529 |
| 2010/0301417 | A1* | 12/2010 | Cheng ................. | H01L 27/0629 257/355 |

* cited by examiner

*Primary Examiner* — Cuong B Nguyen
(74) *Attorney, Agent, or Firm* — Amerson Law Firm, PLLC (57) ABSTRACT A method of forming a semiconductor device comprising a fuse is provided including providing a semiconductor-on-insulator (SOI) structure comprising an insulating layer and a semiconductor layer formed on the insulating layer, forming raised semiconductor regions on the semiconductor layer adjacent to a central portion of the semiconductor layer and performing a silicidation process of the central portion of the semiconductor layer and the raised semiconductor regions to form a silicided semiconductor layer and silicided raised semiconductor regions.

18 Claims, 6 Drawing Sheets

E-FUSE IN SOI CONFIGURATION

BACKGROUND OF THE INVENTION

1. Field of the Invention

Generally, the subject matter disclosed herein relates to integrated circuits, and, more particularly, to SOI devices. More particularly, the subject matter disclosed herein relates to e-fuses formed in SOI configurations.

2. Description of the Related Art

Integrated circuits formed on semiconductor wafers typically include a large number of circuit elements, which form an electric circuit. In addition to active devices such as, for example, field effect transistors and/or bipolar transistors, integrated circuits can include passive devices such as resistors, inductors and/or capacitors. In particular, during the fabrication of complex integrated circuits using CMOS technology, millions of transistors, i.e., N-channel transistors and P-channel transistors, are formed on a substrate including a crystalline semiconductor layer.

A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length is a dominant design criterion for accomplishing an increase in the operating speed of the integrated circuits.

In order to improve the product yield, a technique has been developed of "trimming" or electrically excluding circuit blocks which are no longer operable. This technique, particularly used during manufacturing of memory arrays, relies on redundant circuit blocks which can be incorporated into the main integrated circuit and activated once a defective circuit portion has been detected. On the other hand, the defective circuit block may be trimmed or electrically removed by blowing a fuse or a group of fuses which can electrically disconnect the defective block from the main circuit when in the open configuration. Reprogramming of an integrated circuit is thus rendered possible in a dynamic manner, even after the chip has been manufactured.

Electronic fuses (e-fuses; the terms "fuse" and "e-fuse" are used as interchangeable terms herein) may be used in complex integrated circuits as important mechanisms to allow adapting the performance of certain circuit portions to comply with performance of other circuit portions, for instance after completing the manufacturing process and/or during use of the semiconductor device, for instance when certain critical circuit portions may no longer comply with corresponding performance criteria, thereby requiring an adaptation of certain circuit portions, such as re-adjusting an internal voltage supply, thereby re-adjusting overall circuit speed and the like.

Electronic fuses provided in the semiconductor devices represent electronic switches that may be activated once in order to provide a desired circuit adaptation. Hence, the electronic fuses may be considered as having a high impedance state, which typically represents a programmed state, and having a low impedance state, typically representing a non-programmed state of the electronic fuse. Since these electronic fuses may have a significant influence on the overall behavior of the entire integrated circuit, a reliable detection of the non-programmed and the programmed state has to be guaranteed, which is accomplished on the basis of appropriately designed logic circuitry. Furthermore, since typically these electronic fuses may be actuated only once over the lifetime of the semiconductor device under consideration, a corresponding programming activity has to ensure that a desired programmed state of the electronic fuse is reliably generated in order to provide well-defined conditions for the further operational lifetime of the device.

The programming of an e-fuse typically involves the application of a voltage pulse, which in turn induces a current pulse of sufficient current density in order to cause a permanent modification of a specific portion of the fuse. Thus, the electronic behavior of the fuse and the corresponding conductors for supplying the current and voltage to the fuse have to be precisely defined to obtain a reliable programmed state of the fuse. For this purpose, polysilicon is conventionally used for the fuse bodies, for instance in combination with a metal silicide, in which electromigration effects, in combination with other effects, caused by the current pulse, such as a significant heat generation, may then result in a permanent line degradation, thereby generating a high-ohmic state of the fuse body.

However, in the course of aggressive downscaling, for example, in the context of sub 28 nm or even sub 22 nm, Very Large Scale Integrated (VLSI) Circuits CMOS technologies, the conventional manufacture of e-fuses proves to be very complicated and bears the risk of severe failures. Moreover, conventionally formed e-fuses have a demand for relatively large areas and e-fuses realized in back end-of-line (Beol) stacks typically suffer from the need for relatively high currents for blowing the fuses. In addition, the conventional manufacturing process for e-fuses cannot readily be integrated in the process flows used for manufacturing Fully Depleted SOI devices including High-K Metal Gate (HKMG) transistor devices.

Therefore, the present disclosure provides a method of manufacturing an e-fuse that can readily be integrated in advanced VLSI CMOS manufacturing and an e-fuse with a simplified design and more reliable operation as compared to the art.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

A method of forming a semiconductor device comprising a fuse is provided including providing a semiconductor-on-insulator (SOI) structure comprising an insulating layer and a semiconductor layer (for example, comprising or consisting of silicon) formed on the insulating layer, forming raised semiconductor regions (for example, comprising or consisting of silicon or silicon-germanium) on the semiconductor layer adjacent to a central portion of the semiconductor layer, and performing a silicidation process of the central portion of the semiconductor layer and the raised semiconductor regions to form a (for example, fully) silicided semiconductor layer and silicided raised semiconductor regions. The silicided semiconductor layer on the insulating layer functions as a fuse that is contacted by the silicided raised semiconductor regions.

Another exemplary method of forming a semiconductor device comprising a fuse and a FET includes the following steps, in particular, to be performed in the cited order: forming an isolation region in a silicon-on-insulator (SOI) structure comprising a semiconductor layer to define a fuse area and a FET area separated by the isolation region, forming a first mask layer over the SOI structure in the fuse area only to cover the semiconductor layer of the SOI structure, forming a gate structure and sidewall spacers at sidewalls of the gate structure in the FET area, forming a second mask layer over the first mask layer (while exposing portions of the same) and only a central portion of the semiconductor layer in the fuse area, removing portions of the first mask layer exposed by the second mask layer, forming raised semiconductor regions on the semiconductor layer adjacent to the central portion of the semiconductor layer while maintaining the second mask layer, forming raised source and drain regions in the FET area, removing the second mask layer and siliciding the raised semiconductor regions and the central portion of the semiconductor layer in the fuse area and the raised source and drain regions in the FET area. The central portion of the semiconductor layer may be fully silicided by the silicide process.

Furthermore, a semiconductor device comprising a fuse and a FET is provided. The fuse is formed in a first area of a semiconductor-in-insulator (SOI) wafer and the FET is formed in a second area of the SOI wafer separated by an isolation region from the first area. The SOI structure includes a semiconductor layer formed on an insulating layer that is formed on a substrate. The semiconductor device further includes, in the first area, a silicided (for example, fully silicided) portion of the semiconductor layer and silicided raised semiconductor regions that are connected to each other by the silicided portion of the semiconductor layer. Further, the semiconductor device, in the second area, includes a channel region comprising a portion of the semiconductor layer, a dielectric layer formed over the channel region, a gate structure formed over the dielectric layer and silicided raised source and drain regions.

In addition, according to an exemplary embodiment, a semiconductor device has an e-fuse formed by a fully silicided portion of a semiconductor layer comprising silicon formed on an insulating layer and connecting a first silicided raised semiconductor layer formed on a first non-silicided portion of the semiconductor layer and a second silicided raised semiconductor layer formed on a second non-silicided portion of the semiconductor layer.

In the above-mentioned embodiments, the thicknesses of the raised semiconductor regions exceed the thickness of the central portion of the semiconductor layer (and, for example, the thickness of the entire semiconductor layer of the provided SOI structure).

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Generally, manufacturing techniques and semiconductor devices in which e-fuses are formed, particularly in which e-fuses and N-channel transistors and/or P-channel transistors are formed, are described herein. The manufacturing techniques may be integrated in CMOS manufacturing processes. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, etc., in principle. The techniques and technologies described herein can be utilized to fabricate MOS integrated circuit devices, including NMOS integrated circuit devices, PMOS integrated circuit devices, and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate. Similarly, an SOI structure is not restricted herein to a silicon layer formed on the insulating layer.

In the following, examples of a method of manufacturing a semiconductor device comprising an e-fuse in accordance with the present disclosure are described with reference to FIGS. 1a-1f and 2a-2g.

Figure 1A:
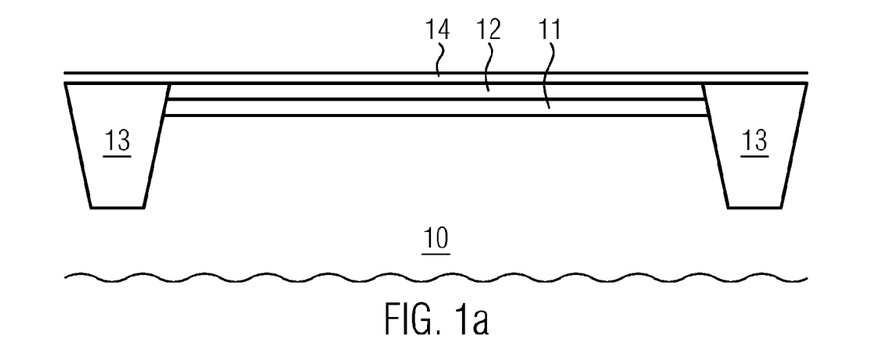
FIGS. 1a-1f illustrate a method of manufacturing a semiconductor device comprising an e-fuse in accordance with an example of the present invention.

As shown in FIG. 1a, a silicon-on-insulator (SOI) structure, for example, a Fully Depleted SOI (FDSOI) structure, comprising a substrate 10, an insulating layer 11 and a semiconductor layer 12 is provided. The substrate 10 may be a semiconductor substrate. The semiconductor substrate may be a silicon substrate, in particular, a single crystal silicon substrate. Other materials may be used to form the semiconductor substrate such as, for example, germanium, silicon germanium, gallium phosphate, gallium arsenide, etc. An insulating layer 11 is formed on the substrate 10. The insulating layer 11 may be a buried oxide (BOX) layer, for example, including silicon dioxide, silicon nitride or any other suitable material. In particular, a thin or ultra-thin BOX layer 11 with a thickness in the range of 10-30 nm may be formed on the substrate 10.

A semiconductor layer 12 is formed on the BOX layer 11. The semiconductor layer 12 may be comprised of any appropriate semiconductor material, such as silicon, silicon/germanium, silicon/carbon, other II-VI or III-V semiconductor components and the like. The semiconductor layer may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. In the following, it is assumed that the semiconductor layer 12 comprises silicon. It goes without saying that the disclosure herein is not limited to this kind of choice of material. The semiconductor layer 12 formed on the BOX layer 11 may have a thickness in the range of 5-30 nm for example, 10-20 nm.

The area designated for forming the e-fuse is defined by isolation regions 13, for example, provided in the form of shallow trench isolations (STI). The isolation regions 13 separate the area designated for forming the e-fuse from areas designed for the formation of N-channel and P-channel transistor devices. In fact, the herein described method of forming an e-fuse can be integrated in the overall process flow of forming integrated circuits comprising FETs (see also description below with reference to FIGS. 2a-2g).

According to the shown example, the manufacturing of the e-fuse is integrated in the process flow of manufacturing Fully Depleted SOI (FDSOI) FETs, particularly on ultra-thin BOX (UTBOX) structures. The process of forming the e-fuse may start after formation of sidewall spacers of the FETs to be formed in another area. For example, the area designated for forming the e-fuse is always protected by a mask layer 14 during the process flow of manufacturing the FETs until the formation of the sidewall spacers of the FETs is completed. The mask layer 14 may be formed of or comprise an oxide material, for example, $SiO_2$. It is crucial that the mask layer 14 protects the semiconductor layer 12 during the various steps of forming and etching a plurality of layers involved in the formation of gate stacks of FETs, such as deposition of a high-k material, a metal material, a polysilicon material and patterning the gate stack and sidewall spacer layers.

Figure 1B:
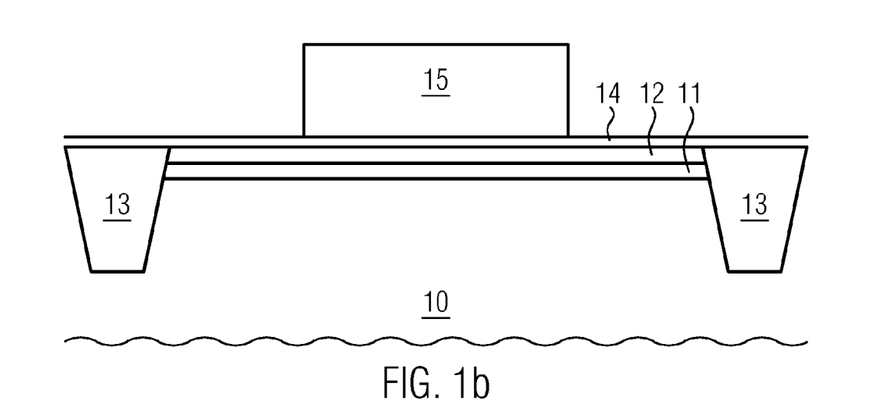

In the manufacturing stage shown in FIG. 1b, another mask layer 15 is formed on the mask layer 14. The other mask layer 15 may be formed of a nitride material, for example, SiN, and is provided to protect a central portion of the area designated for forming the e-fuse against the deposition of silicon or silicon-germanium material used to form raised source and drain regions for the FETs. On the other hand, the mask layer 14 is removed adjacent to the mask layer 15, for example, by a HF pre-clean step, to allow for a proper formation of Si or SiGe regions in the area designated for forming the e-fuse adjacent to the patterned hard mask layer 15. An Si or SiGe layer with a thickness in the range of 20-40 nm, for example, may be formed on the exposed semiconductor layer 12, for example, by epitaxial growth.

Figure 1C:
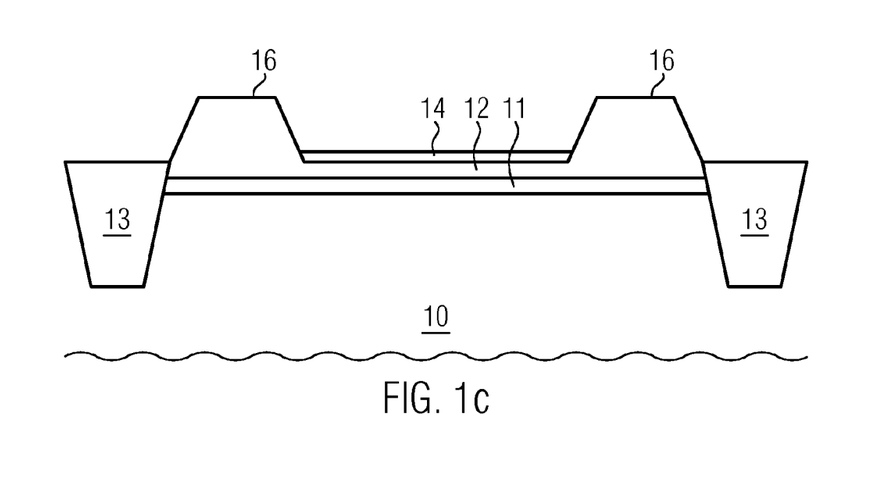

After formation of the silicon or silicon-germanium material 16, the hard mask 15 is removed, as illustrated in FIG. 1c. The removal of the hard mask 15 may be achieved by a $H_3PO_4$ strip of reactive ion etching (RIE) that stops on the underlying (for example, $SiO_2$) mask layer 14.

Figure 1D:
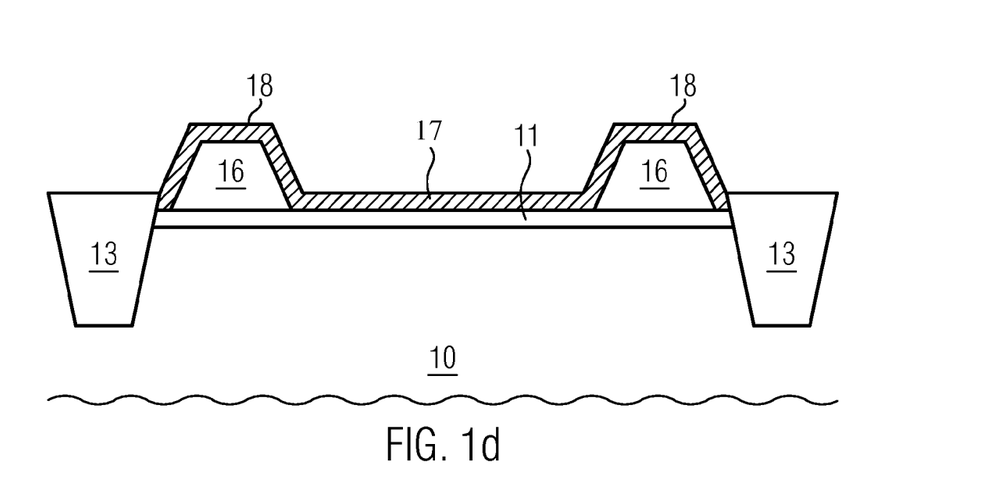

In the manufacturing step shown in FIG. 1d, mask layer 14 has been removed and both the semiconductor layer 12 as well as the upper portions of the deposited Si or SiGe material 16 are silicided to form a silicided semiconductor layer 17 and silicided Si or SiGe material 18. Silicidation may be achieved, for example, by depositing an NiPt, Ni or Co layer on the surfaces of the semiconductor layer 12 and the deposited Si or SiGe material 16 and performing one or more thermal anneal processes, as it is known in the art.

Figure 1E:
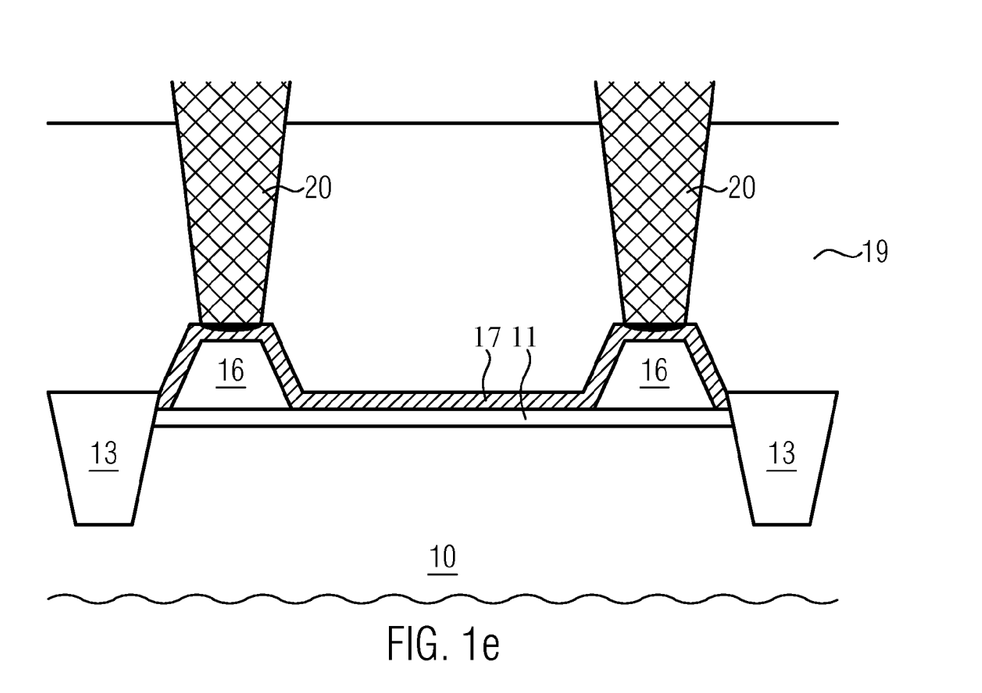
Figure 1F:
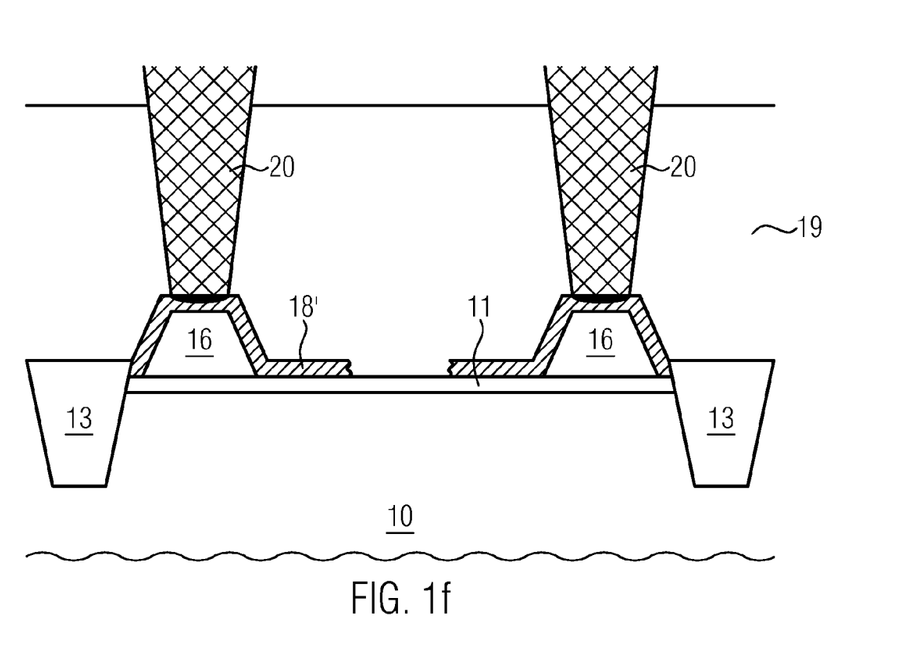

In the manufacturing stage shown in FIG. 1e, an insulation layer 19 is formed over the structure shown in FIG. 1d. The insulation layer 19 may be formed by plasma enriched nitride deposition. Contacts 20 are formed to the raised silicided Si or SiGe material layers 18 on both sides of the silicided semiconductor layer 17. After forming the contacts 20, the ultra-thin e-fuse is completed and ready for burn-in. The silicided Si or SiGe material layers 18 (silicided contacts) show a low electrical resistivity and thereby facilitate current flow for burning-in the fuse. The fuse after burn-in is shown in FIG. 1f. An electrical current has been applied by the contacts 20 to the silicided semiconductor layer 17. The electrical current has partially melted and burned away the silicided semiconductor layer 17, thereby generating a broken silicided semiconductor layer 18'. Due to the broken silicided semiconductor layer 18', the fuse changed into a high resistive stage.

Figure 2A:
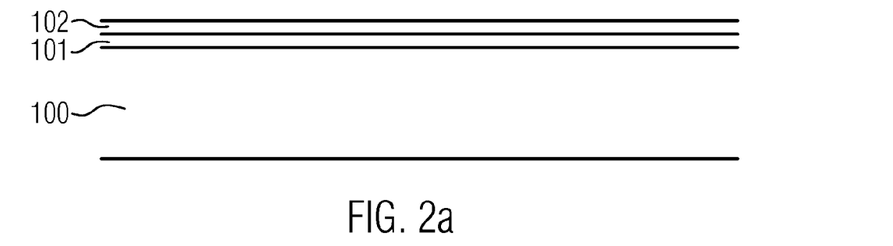
FIGS. 2a-2g illustrate a method of manufacturing a semiconductor device comprising an e-fuse and a FET in accordance with an example of the present invention.

Another example of manufacturing an e-fuse according to an inventive example integrated in the process flow of manufacturing a FET is illustrated in FIGS. 2a-2g. An FDSOI structure with a substrate 100, an ultra-thin BOX layer 101, for example, with a thickness in the range of 10-30 nm, and an ultra-thin semiconductor layer 102, for example, with a thickness in the range of 10-20 nm, is provided as shown in FIG. 2a. The substrate 100 may be a silicon substrate, in particular, a single crystal silicon substrate. Other materials may be used to form the substrate 100 such as, for example, germanium, silicon germanium, gallium phosphide, gallium arsenide, etc. The BOX layer 101 may, for example, include silicon dioxide, silicon nitride or any other suitable material.

The semiconductor layer 102 formed on the BOX layer 101 may be comprised of any appropriate semiconductor material, such as silicon, silicon/germanium, silicon/carbon, other II-VI or III-V semiconductor components and the like. The semiconductor layer may comprise a significant amount of silicon, or any other appropriate semiconductor materials may be used, for instance, a silicon-based material containing other iso-electronic components, such as germanium, carbon and the like. In the following, it is assumed that the semiconductor layer 102 comprises silicon, without limiting the disclosure herein to this kind of choice of material.

Figure 2B:
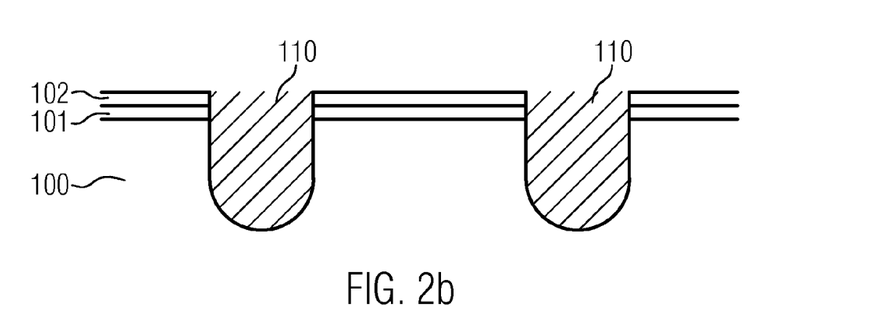
Figure 2C:
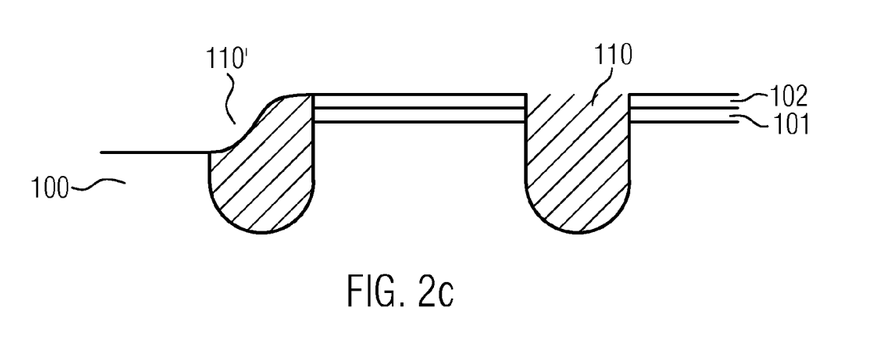

An area designated for forming the e-fuse is defined by isolation regions 110, for example, shallow trench isolations (STI), that are formed by appropriate lithography techniques as known in the art (see FIG. 2b). In the manufacturing stage shown in FIG. 2c, a No-SOI area is formed wherein the semiconductor layer 102 and the BOX layer 101 are removed.

Formation of such a No-SOI region is necessary for forming I/O or LDMOS devices, as well as other non-FET devices, for example, diodes or bipolar junction transistors. For example, passive devices such as capacitors or resistors may be formed in the No-SOI area. The No-SOI area may be built by depositing and patterning an SiN mask and subsequently performing reactive ion etching. Depending on the actual design, the No-SOI area may or may not comprise a part of the neighbored isolation region 110'. On the left-hand side of the No-SOI shown in FIG. 2c and adjacent thereto a standard SOI area may be provided.

An area designated for the formation of an e-fuse is defined between the isolation regions 110' and 110. In particular, the isolation region 110 on the right-hand side of FIG. 2c separates the area designated for forming the e-fuse from an area designated for forming a FET. In the following manufacturing stages, the area designated for forming of an e-fuse and the area designated for forming a FET separated by the isolation region are shown only.

Figure 2D:
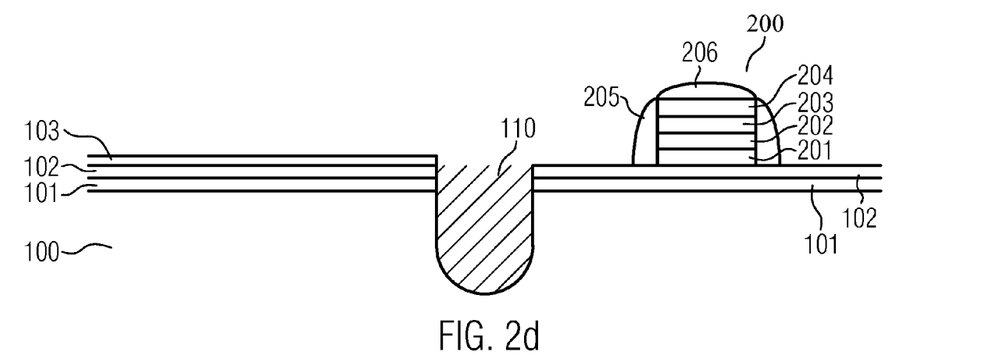

In the manufacturing stage shown in FIG. 2d, a FET 200 is formed on the area designated for forming a FET. During the manufacturing steps for forming the FET 200 shown in FIG. 2d, the semiconductor layer 102 of the area designated for forming an e-fuse is protected by an oxide mask layer 103, for example, by an $SiO_2$ layer 103, as described with respect to the embodiment illustrated in FIG. 1a.

The FET 200 of FIG. 2d, which may be an N-channel or P-channel FET with a suitably doped channel region formed in the semiconductor layer 102, may be formed as follows. A high-k dielectric layer 201, a work function adjusting layer 202, a metal gate layer 203 and a polysilicon layer 204 may subsequently be formed. Moreover, a cap layer 206 that may comprise a silicon oxide material and may have a thickness in a range from 10-100 nm, for example, in a range from 20-50 nm, may be formed over the polysilicon layer 204. The stack of layers is etched to provide the gate structure shown in FIG. 2d.

The high-k dielectric layer 201, for example, with k>5, may comprise a transitional metal oxide, such as at least one of hafnium oxide, hafnium dioxide and hafnium silicon-oxynitride. According to some exemplary embodiments, the high-k dielectric layer 201 may be formed directly on the semiconductor layer 102. According to other embodiments, the high-k dielectric layer 201 may be formed on an insulating layer (not shown) comprising silicon oxide which is formed on the semiconductor layer 102. The work function adjusting layer 202 may comprise titanium nitride (TiN) or any other appropriate work function adjusting metal or metal oxide that is known in the art.

The metal gate layer 03 may comprise a plurality of layers that may include Al, AlN or TiN. In particular, the metal gate layer 203 may comprise a work function adjusting material that comprises an appropriate transition metal nitride, for example, those from Groups 4-6 in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN) and the like, with a thickness of about 1-60 nm, work function adjusting layer 202 can be integrated in the metal gate layer 203.

A sidewall spacer 205 adjacent to the gate electrode comprising the metal gate and poly gate may be formed. A liner layer (not shown) may be provided between the gate electrode and the sidewall spacer. The sidewall spacer 205 may include silicon dioxide, and the liner layer may include silicon nitride or vice sa. The sidewall spacer 205 may be provided in the form of a multilayer by subsequently epitaxially growing or depositing the respective layers of the gate structure and appropriately etching them.

It is noted that there are basically two well-known processing methods for forming a planar or 3D transistor with a high-k metal gate (HKMG) structure. In the replacement gate technique, a so-called "dummy" or sacrificial gate structure is initially formed and remains in place as many process operations are performed to form the device, for example, the formation of doped source/drain regions, performing an anneal process to repair damage to the substrate caused by the ion implantation processes and to activate the implanted dopant materials. At some point in the process flow, the sacrificial gate structure is removed to define a gate cavity where the final HKMG gate structure for the device is formed. Using the "gate first" technique, on the other hand, involves forming a stack of layers of material across the substrate, wherein the stack of materials includes a high-k gate insulation layer, one or more metal layers, a layer of polysilicon, and a protective cap layer, for example, silicon nitride. One or more etching processes are performed to pattern the stack of materials to thereby define the basic gate structures for the transistor devices.

Formation of a fuse in accordance with the present disclosure can be readily integrated in both the replacement gate process flow and gate first process flow.

An implantation step during which source and drain extension regions may be formed in the semiconductor layer 102 may follow the formation of the sidewall spacers 205. In this case, the sidewall spacers 205 represent an implantation mask for the implantation of source/drain extension regions. The source/drain extension regions are, therefore, aligned with regard to the sidewall spacers 205. The cap layer 206 protects the gate electrode structure of FET 200 from being affected by the implantation. A halo implantation step may also be performed if considered appropriate.

Figure 2E:
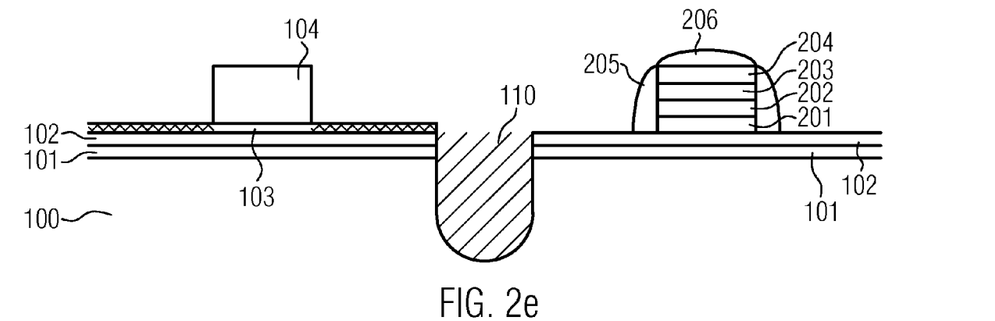

In the manufacturing step shown in FIG. 2e, a hard mask 104, for example, an SiN mask, is formed on the mask layer 103 in a central region of the fuse area, i.e., over a central portion of the semiconductor layer 102 in the area designated for forming a fuse. The portion of the mask layer 103 that is exposed by the hard mask layer 104 is removed, as indicated by the cross-hatching in FIG. 2e. For example, etching is performed to remove the exposed portion of the $SiO_2$ layer 103 by means of HF either in gaseous or liquid state or a combination of steps and chemicals which include gaseous HF or liquid HF.

Figure 2F:
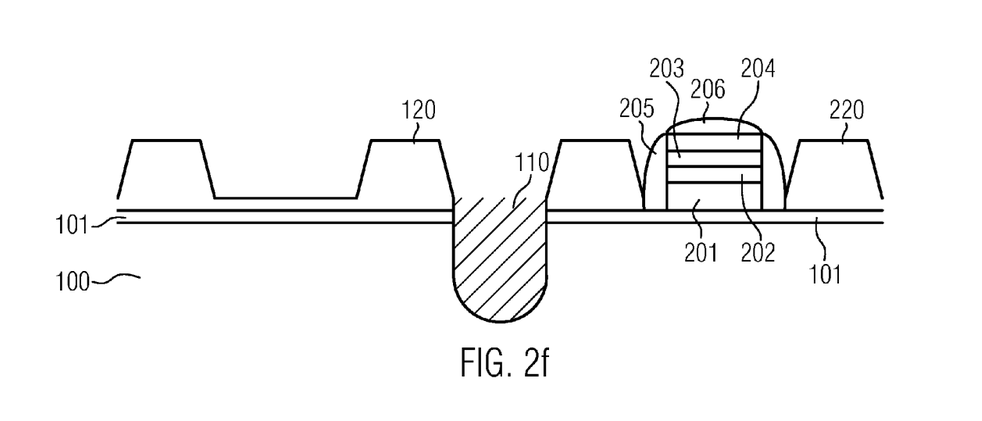

A semiconductor layer, for example, a semiconductor layer comprising silicon, for example, a silicon layer or a silicon-germanium layer is formed, for example, by (selective) epitaxy, in both the fuse area and the FET area on the exposed semiconductor layer 102. Thereby, raised source and drain regions 220 are formed adjacent to the sidewall spacers 205 in the FET area and, similarly, in the same process, the raised semiconductor regions 120 are formed in the fuse area, as shown in FIG. 2f. The raised source and drain regions 220 and the raised semiconductor regions 120 may have thicknesses in the range of 30-60 nm, for example. Moreover, the mask layers 103 and 104 are removed. When removing the hard mask 104, mask layer 103 functions as an etch stop layer. For example, SiN mask layer 104 is removed by $H_3PO_4$ etching or RIE. For example, the remaining $SiO_2$ mask layer 103 is removed by HF etching after to noval of the hard mask layer 104. Moreover, the cap layer 206 covering the poly gate 204 is removed.

Figure 2G:
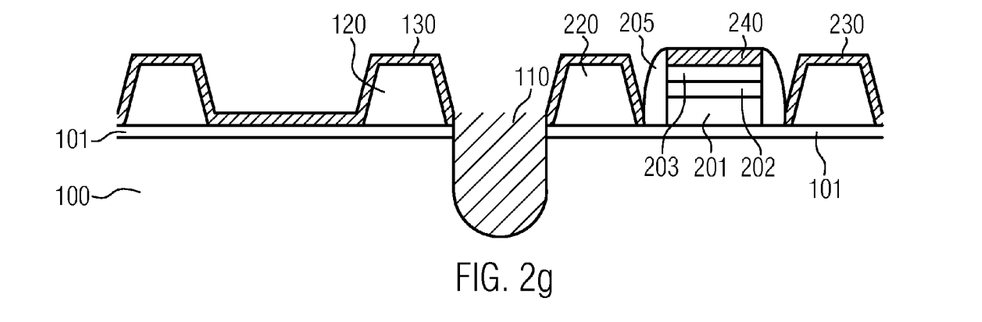

After removal of the mask layers 103 and 104, the raised semiconductor regions 120 and 220 as well as the poly gate 204 are silicided, as shown in FIG. 2g. Silicidation may comprise deposition of an NiPt, Ni or Co layer on the surfaces of the raised semiconductor regions 120 and 220 and the poly gate 204 and performing one or more thermal anneal processes. The resulting silicided regions 130, 230 and 240 provide for low-resistance contacts. In the shown example, the thin semiconductor layer 102 on the FDSOI fuse area is fully silicided. The resulting fuse is ready for burn-in.

As a result, herein is provided a method of manufacturing a semiconductor device comprising an e-fuse. The method can readily be integrated in standard FDSOI techniques including gate-first or replacement gate processing and allows for accurately designing the fuse with respect to the magnitude of the burn-in current by selecting the geometrical properties and silicided contacts. The ultra-thin silicide fuse isolated by an UTBOX offers the advantage of a very good burn-in performance. Area dimensions can significantly be reduced as compared to the prior art.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method of forming a semiconductor device comprising a fuse, the method comprising:
   providing a semiconductor-on-insulator (SOI) structure comprising an insulating layer and a semiconductor layer formed on said insulating layer;
   forming an isolation region in said SOI structure separating first and second regions of said SOI structure;
   forming raised semiconductor regions on said semiconductor layer adjacent to a central portion of said semiconductor layer on said first region;
   performing a silicidation process of said central portion of said semiconductor layer and said raised semiconductor regions to form a silicided semiconductor layer and silicided raised semiconductor regions; and
   forming a transistor device on said second region, wherein forming said transistor device comprises forming a gate stack and sidewall spacers at sidewalls of said gate stack and further comprising forming a mask layer over said semiconductor layer before forming said raised semiconductor regions and after forming said gate stack and said sidewall spacers.

2. The method of claim 1, wherein forming said transistor device comprises forming raised source and drain regions and further comprising forming said mask layer before forming said raised source and drain regions.

3. The method of claim 1, further comprising forming an additional insulating layer over said silicided semiconductor layer and said silicided raised semiconductor regions, forming openings in said additional insulating layer reaching to said silicided raised semiconductor regions and filling said openings with an electrically conductive contact material.

4. The method of claim 1, wherein said semiconductor layer comprises silicon and said raised semiconductor regions are formed by epitaxial growth of a semiconductor material comprising one of silicon and silicon-germanium.

5. The method of claim 1, wherein said insulating layer has a thickness of below 30 nm and said central portion of said semiconductor layer has a thickness of below 20 nm.

6. A method of forming a semiconductor device comprising a fuse and a FET, the method comprising:
   forming an isolation region in a silicon-on-insulator (SOI) structure comprising a semiconductor layer to define a fuse area and a FET area separated by said isolation region;
   forming a first mask layer over said SOI structure in said fuse area only to cover said semiconductor layer of said SOI structure;
   forming a gate structure and sidewall spacers at sidewalls of said gate structure in said FET area;
   forming a second mask layer over said first mask layer and over only a central portion of said semiconductor layer in said fuse area;
   removing portions of said first mask layer exposed by said second mask layer;
   forming raised semiconductor regions on said semiconductor layer adjacent to said central portion of said semiconductor layer while maintaining said second mask layer;

forming raised source and drain regions in said FET area;
removing said second mask layer; and
siliciding said raised semiconductor regions and said central portion of said semiconductor layer in said fuse area and said raised source and drain regions in said FET area.

7. The method of claim 6, wherein said raised semiconductor regions in said fuse area and said raised source and drain regions in said FET area are formed within one single process.

8. The method of claim 6, further comprising forming a channel region below said gate structure comprising a portion of said semiconductor layer and wherein said central portion of said semiconductor layer in said fuse area and said channel region comprise silicon and said raised semiconductor regions and said raised source and drain regions are formed by epitaxial growth of a semiconductor material comprising one of silicon and silicon-germanium.

9. The method of claim 6, wherein forming said gate structure comprises forming a high-k gate dielectric and forming a metal gate over said high-k dielectric.

10. The method of claim 6, wherein said SOI structure comprises an insulating layer with a thickness of below 30 nm formed below said central portion of said semiconductor layer and wherein said central portion of said semiconductor layer has a thickness of below 20 nm.

11. A method of forming a semiconductor device comprising a fuse, the method comprising:
providing a semiconductor-on-insulator (SOI) structure comprising an insulating layer and a semiconductor layer formed on said insulating layer;
forming a first mask layer above a central portion of said semiconductor layer;
forming raised semiconductor regions on said semiconductor layer adjacent to said central portion of said semiconductor layer in the presence of said first mask layer;
removing said first mask layer; and
performing a silicidation process of said central portion of said semiconductor layer and said raised semiconductor regions to form a silicided semiconductor layer and silicided raised semiconductor regions.

12. The method of claim 11, wherein forming said first mask layer comprises:
forming a second mask layer above said semiconductor layer prior to forming said first mask layer;
removing portions of said second mask layer exposed by said first mask layer; and
forming said second raised semiconductor regions on portions of said semiconductor layer exposed by removing said portions of said second mask layer.

13. The method of claim 11, further comprising:
forming an isolation region in said SOI structure separating first and second regions of said SOI structure, wherein said silicided semiconductor layer and said silicided raised semiconductor regions are formed on said first region; and
forming a transistor device on said second region.

14. The method of claim 13, wherein forming said transistor device comprises forming a gate stack and sidewall spacers at sidewalls of said gate stack and further comprising forming said first mask layer over said semiconductor layer before forming said raised semiconductor regions and after forming said gate stack and said sidewall spacers.

15. The method of claim 13, wherein forming said transistor device comprises forming a gate stack, sidewall spacers at sidewalls of said gate stack and raised source and drain regions and further comprising forming said first mask layer over said semiconductor layer before forming said raised semiconductor regions and said raised source and drain regions and after forming said gate stack and said sidewall spacers.

16. The method of claim 11, further comprising forming an additional insulating layer over said silicided semiconductor layer and said silicided raised semiconductor regions, forming openings in said additional insulating layer reaching to said silicided raised semiconductor regions and filling said openings with an electrically conductive contact material.

17. The method of claim 11, wherein said semiconductor layer comprises silicon and said raised semiconductor regions are formed by epitaxial growth of a semiconductor material comprising one of silicon and silicon-germanium.

18. The method of claim 1, wherein said insulating layer has a thickness of below 30 nm and said central portion of said semiconductor layer has a thickness of below 20 nm.

* * * * *

UNITED STATES PATENT AND TRADEMARK OFFICE
CERTIFICATE OF CORRECTION

PATENT NO. : 9,553,046 B2  
APPLICATION NO. : 14/718502  
DATED : January 24, 2017  
INVENTOR(S) : Jan Hoentschel, Peter Baars and Hans-Peter Moll Page 1 of 1

It is certified that error appears in the above-identified patent and that said Letters Patent is hereby corrected as shown below:

Column 12, Line 40 (Claim 18, Line 1), change "claim 1" to "claim 11".

Signed and Sealed this
Seventh Day of March, 2017

Michelle K. Lee
*Director of the United States Patent and Trademark Office*